United States Patent [19]

Manelas

[11] 4,080,221
[45] Mar. 21, 1978

[54] SOLAR CELL ELECTRIC AND HEATING SYSTEM

[76] Inventor: Arthur J. Manelas, 38 Meadow Dr., Lowell, Mass. 01854

[21] Appl. No.: 740,232

[22] Filed: Nov. 9, 1976

[51] Int. Cl.² .......................... H01L 31/04; F24J 3/02
[52] U.S. Cl. .............................. 136/89 PC; 126/270; 126/271; 136/89 HY; 136/89 AC; 237/1 A; 320/2; 52/173 R
[58] Field of Search ........ 136/89 AC, 89 PC, 89 HY; 126/270, 271; 237/1 A; 52/173 R

[56] References Cited

U.S. PATENT DOCUMENTS

| 2,780,765 | 2/1957 | Chapin et al. | 320/2 |
|---|---|---|---|
| 2,946,945 | 7/1960 | Regnier et al. | 320/2 |
| 3,087,309 | 4/1963 | Toulmin, Jr. | 62/3 |
| 3,232,795 | 2/1966 | Gillette et al. | 136/89 PC |
| 3,427,200 | 2/1969 | Lapin et al. | 136/89 PC |
| 3,866,285 | 2/1975 | Clark | 29/157 R |
| 4,023,368 | 5/1977 | Kelly | 60/698 |
| 4,026,267 | 5/1977 | Coleman | 126/270 |

OTHER PUBLICATIONS

E. R. Ralph, "A Plan to Utilize Solar Energy as an Electric Power Source", *Conf. Record, IEEE Photospecialists Conf.*, Aug. 1970, pp. 326-328.

E. L. Ralph, "Use of Concentrated Sunlight with Solar Cells for Terrestrial Applications", Solar Energy, vol. 10, pp. 67-71 (1966).

D. G. Schueler et al., "Integration of Photovoltaic & Solar-Thermal Energy Conversion Systems", Conf. Record, 11th IEEE Photospecialists Conf., May 1975, pp. 327-331.

Chemistry & Industry, Aug. 1975, pp. 675-676.

*Primary Examiner*—John H. Mack
*Assistant Examiner*—Aaron Weisstuch
*Attorney, Agent, or Firm*—Pearson & Pearson

[57] ABSTRACT

A system for converting solar energy into electric energy at reduced cost makes use of an array of light sensitive, voltage producing solar cells of the flat disc silicon type. To increase power, while using fewer costly cells, each cell of the array has a truncated conical shell mounted on legs at a spaced distance thereover, the shell having a mirror-like reflective inner surface. Thus, sunlight is received in the large end and reflected through the small end to the cell. A sealed, weather-tight enclosure for the array, has fluid inlets and outlets for producing heat, the heat conductive shells absorbing and radiating heat.

11 Claims, 7 Drawing Figures

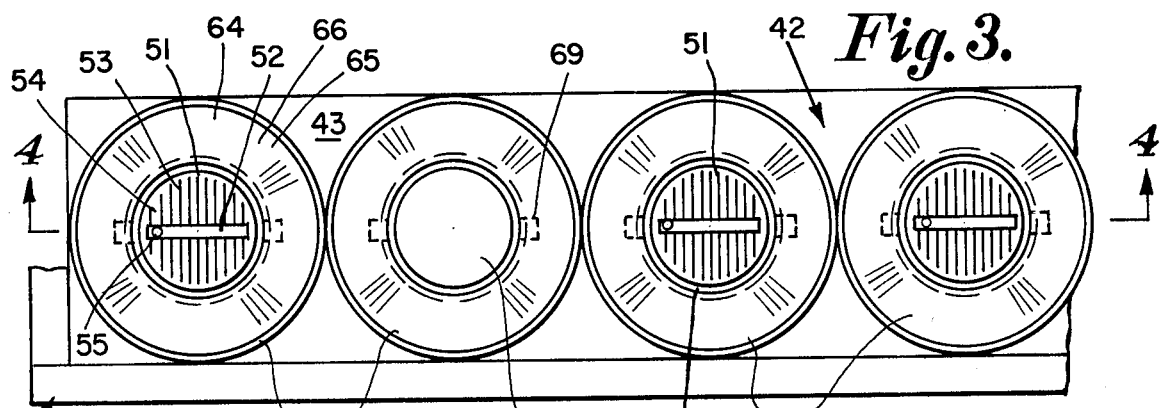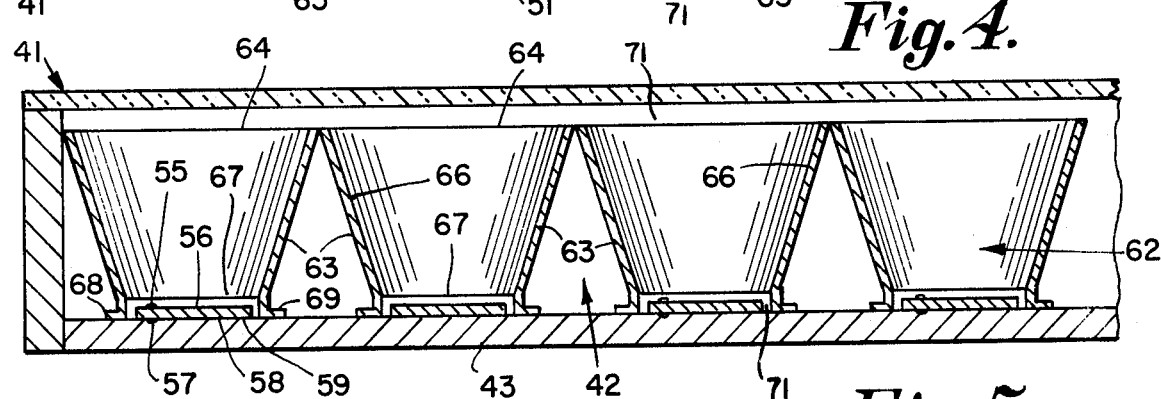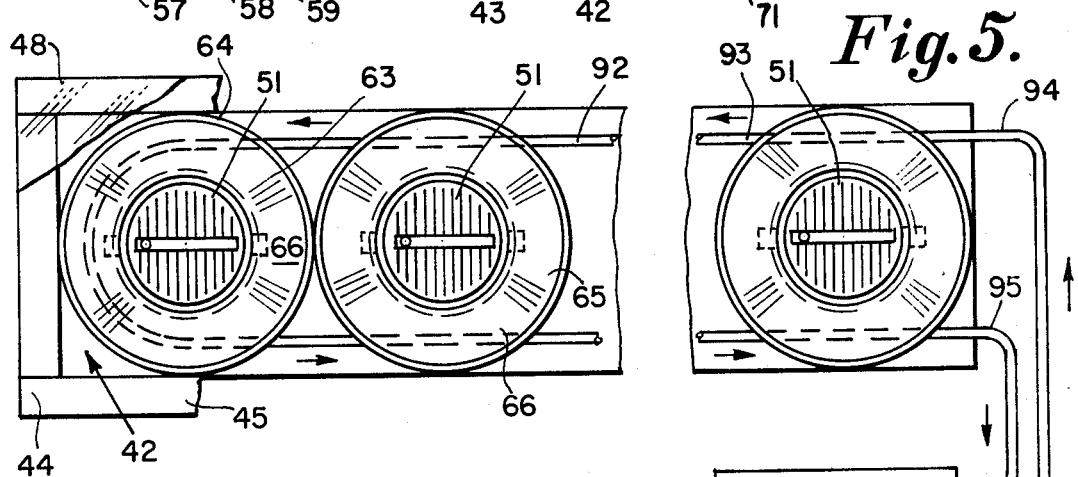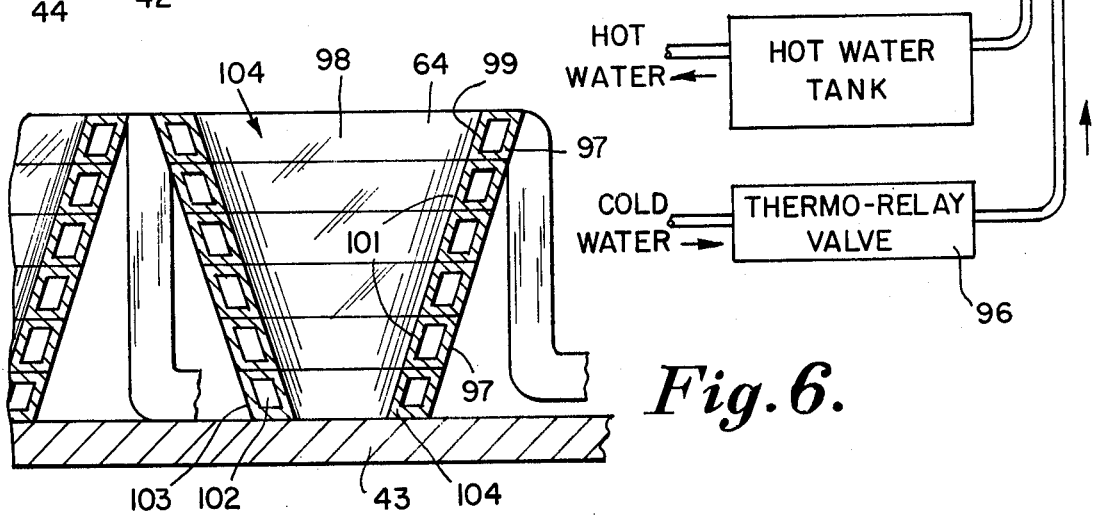

SOLAR CELL ELECTRIC AND HEATING SYSTEM

BACKGROUND OF THE INVENTION

The turning of sunlight into useful energy has been the subject of many proposed systems, such as passive absorbers, active solar panels, solar electric cells and solar furnaces.

In the solar electric cell art, it is already known to mount an array of silicon solar cells on a substrate and link them electrically to produce a small amount of electric energy capable of operating a railroad crossing signal light or the like. However, it has been estimated that it would cost $150,000.00 to supply enough solar cells to cover the roof of an average house and thereby provide sufficient wattage to energize the electric appliances, stoves, television sets, etc. of the house.

To increase the energy produced by an array of solar cells, it has been proposed in U.S. Pat. No. 3,108,313 to Gattone of Jan. 23, 1962 to provide a plurality of superposed layers of light convergent lenses arranged in cascade for intensifying the light received by the cells. However, such lenses even when of plastic are costly and the plastic used may not stand up in the heat generated within the enclosure by the sun, which may reach 200° Fahrenheit or over.

SUMMARY OF THE INVENTION

In this invention the solar cells are mounted at spaced distances apart on a rigid planar backing, or bottom, of an enclosure, the backing being black and each cell being a disc of predetermined area. Such discs are commercially available for example from Solar Power Corporation, 5 Executive Park Drive, Billerica, Massachusetts. They are about 3.5 inches in diameter, capable of producing about 0.6 watts of energy in strong sunlight and costs about $15.00 each. Used alone, an array of such discs would cost about $45,000.00 to produce 300 kilowatts of energy a month.

Instead of costly "plexiglass" lenses, in this invention I provide an array of truncated-conical, light-collector shells, preferably of aluminum with a mirror-like high polish finish, inner surface on the truncated conical side wall of the shell. Thus, the solar cells may be of small diameter and spaced apart for reduced cost, but the sunlight is collected in the larger opening of the shell and reflected from the polished surface down through the smaller opening of the shell to the cell it encircles.

The solar cells are electrically linked into a control circuit which includes at least nine storage batteries, a one way diode to prevent energy returning to the cells when darkness occurs and the household electric circuit with its appliances. Because a television set requires alternating current, the circuit preferably includes a separate large storage battery for powering the television and energized by the solar cells, there being a suitable DC/AC converter in the circuit.

The enclosure containing the array of cells and truncated conical light collectors is sealed and weatherproofed to protect the parts from the elements. The enclosure includes a cold air inlet in the lower portion supplied from the ambient air in a building to be heated, and includes a hot air outlet in the upper portion of the enclosure which connects to a fire brick heat storage member in the cellar of the building and thence to the hot air heating system of the building. The metal shells of the invention are of heat conductive metal and act as heat absorbers and radiators in heating the air in the enclosure while also performing their function of collecting and reflecting sunlight.

The system of the invention may also include a supplementary tap water heating system, wherein water conduits in the form of thin walled plastic or glass tubing extend into the sealed enclosures and around the peripheries of the cells to absorb heat which is conducted back to the water tank of the main tap water system of the house. A thermal valve connects the two systems at predetermined temperatures.

The truncated conical shells of the invention may be formed by convolutions of hollow fluid conduits of square cross section in which case they heat water while helping to generate electrical energy.

BRIEF DESCRIPTION OF THE DRAWINGS

FIG. 3 is a still further enlarged fragmentary top plan view of a row of solar cells and truncated conical shells of the invention;

FIG. 4 is a front elevation in section on line 4—4 of FIG. 3;

FIG. 5 is a view similar to FIG. 3 showing a fluid conduit in the enclosure;

FIG. 6 is a side elevation, in half section, of a truncated conical shell formed by a convoluted pipe of square cross section to form a liquid jacket therearound.

DESCRIPTION OF A PREFERRED EMBODIMENT

Figure 1:
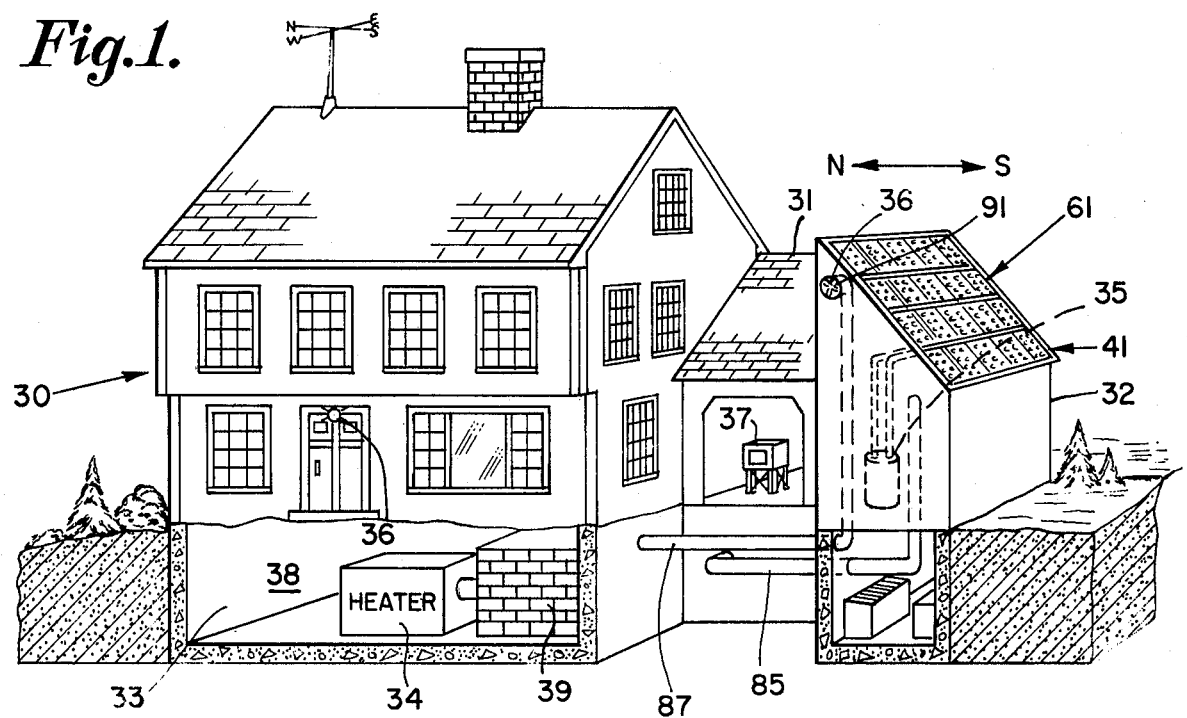
FIG. 1 is a schematic perspective view from the front of a typical residence showing the solar system of the invention installed therein; and with parts broken away.
Figure 2:
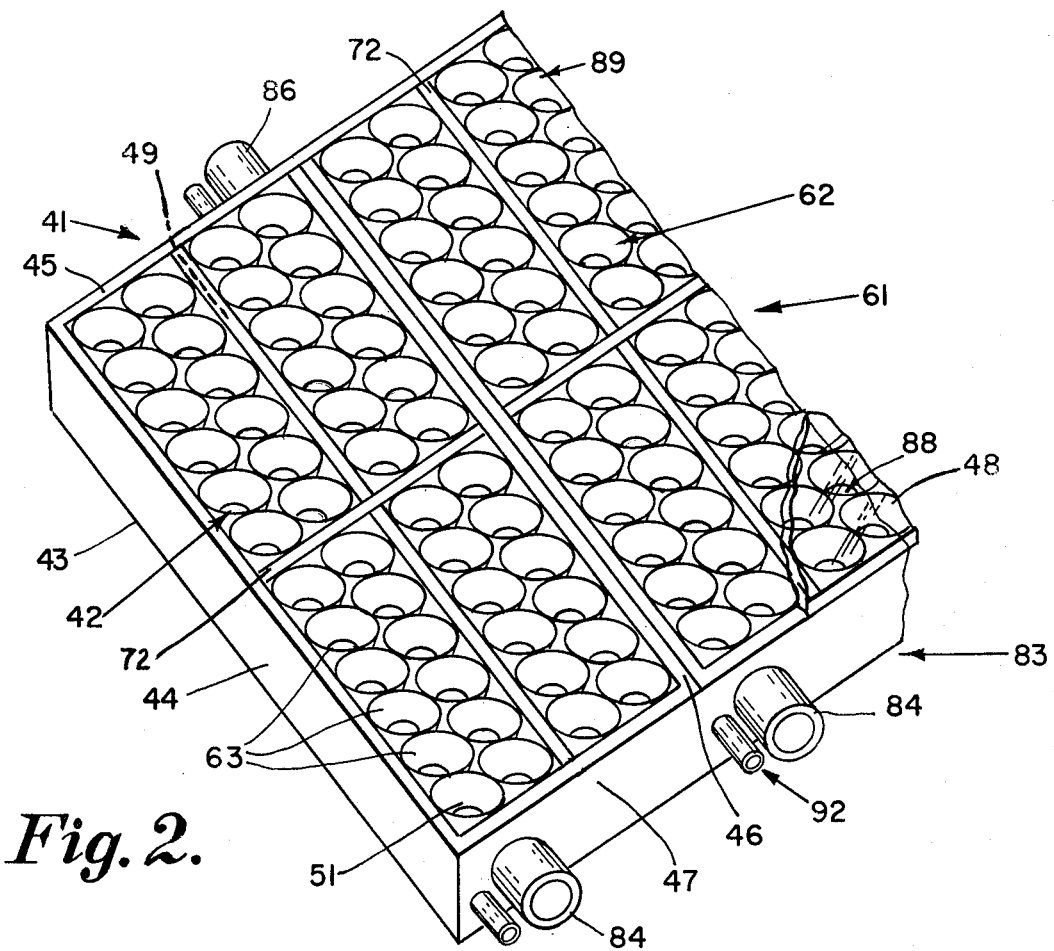
FIG. 2 is an enlarged, fragmentary, perspective view of a power pack unit of the invention.

As shown in FIG. 1 a typical building such as the residence 30, may have a breezeway 31, an ell 32, cellar 33, hot air heating system 34, main tap water heating system 35, electric appliances 36 and a television 37. In the ambient air space 38 of the cellar 33 there is a heat storage member 39 which may be constructed of about five tons of apertured fire bricks and which is arranged to store solar heat for use when needed on sunless days.

The power pack panel 61 of the invention is about 8 feet wide, 16 feet long and 12 inches thick and is preferably mounted at an angle of 45° from the horizontal facing South for example on the roof of the ell 32. The angle of inclination will depend on the geographical location, 45° having been found best for the Commonwealth of Massachusetts.

The power pack unit 41, includes a substantially sealed, weather tight enclosure 42 having a rigid, planar bottom 43, which is preferably black, side walls 44, 45, 46 and 47, upstanding from bottom 43 and preferably of rectangular configuration, and a top, or cover, 48 of transparent material such as plastic of the "Plexiglass", or glass, type. The bottom 43 and the side walls 44, 45, 46 and 47 are of heat insulation sheet material, or include a central layer 49 of heat insulation such as "Fiberglas" to prevent losing heat to the ambient atmosphere.

Within the sealed enclosure 42 a plurality of light-sensitive, voltage producing, solar cells 51 are arrayed in a common plane, at predetermined spaced distances apart, on the rigid planar bottom 43. The cells 51 may be of any suitable type, but preferably are silicon cells of flat, thin disc, or wafer, configuration, commercially available, for example, from Solar Power Corporation, 5 Executive Park Drive, Billerica, Massachusetts. Each solar cell 51 is of predetermined area with a diameter of about three and one half inches and includes an electrically conductive back bone 52, with spaced rods, or wires 53, normal thereto and in parallelism with each other, all embedded in a black backing 54 with one terminal 55 on the back bone 52 on the exposed face 56 (FIG. 4) of the silicon cell and the other terminal 57 on the foil 58 on the underface 59 of the cell. Each cell is capable of producing 0.6 watts of energy in strong sunlight.

To permit the use of fewer costly solar cells, and thereby bring the cost of the solar energy system 61 of the invention down to a reasonable amount, flared light reflector means 62 is provided in each enclosure 42, preferably one for each cell 51 therein. The flared light reflector means 62 is mounted within the enclosure 42 between the array of spaced apart, common-planar cells 51 and the transparent top 48 for collecting light from the sun over a larger total area than the total area of the cells in the enclosure and reflecting the light onto the cells as the sun rises and sets during the day.

Flared light reflector means 62 preferably comprises a plurality of truncated conical shells 63 of aluminum, or other heat conductive material. Each shell has a large open end 64 proximate the top 48, and of substantially greater area than the area of a cell 51, a truncated-conical side wall 65 with a mirror-like polished, light-reflective, inner, flared surface 66 and a small open end 67, encircling a cell 51 at a spaced distance thereabove by support of a pair of integral legs 68, 69 affixed to the planar bottom 43.

In the illustrated embodiment wherein the cells 51 are each about 3½ inches in diameter, the small open end 67 is about 3¾ inches in diameter and supported about ½ inch above the cell to provide air circulation space 71. The large open end 64 is about 7½ in diameter and the side wall 65 is about 4 inches in vertical height.

Preferably the truncated conical side wall 65 of each shell 63 is inclined at about 15° from the vertical, of 75° from the plane of enclosure bottom 43, since this degree of inclination in the Massachusetts area provides the optimum angle for collecting useful sunlight in the open ends 64 and reflecting the light out through the small ends 67 onto the cells 51.

Figure 7:
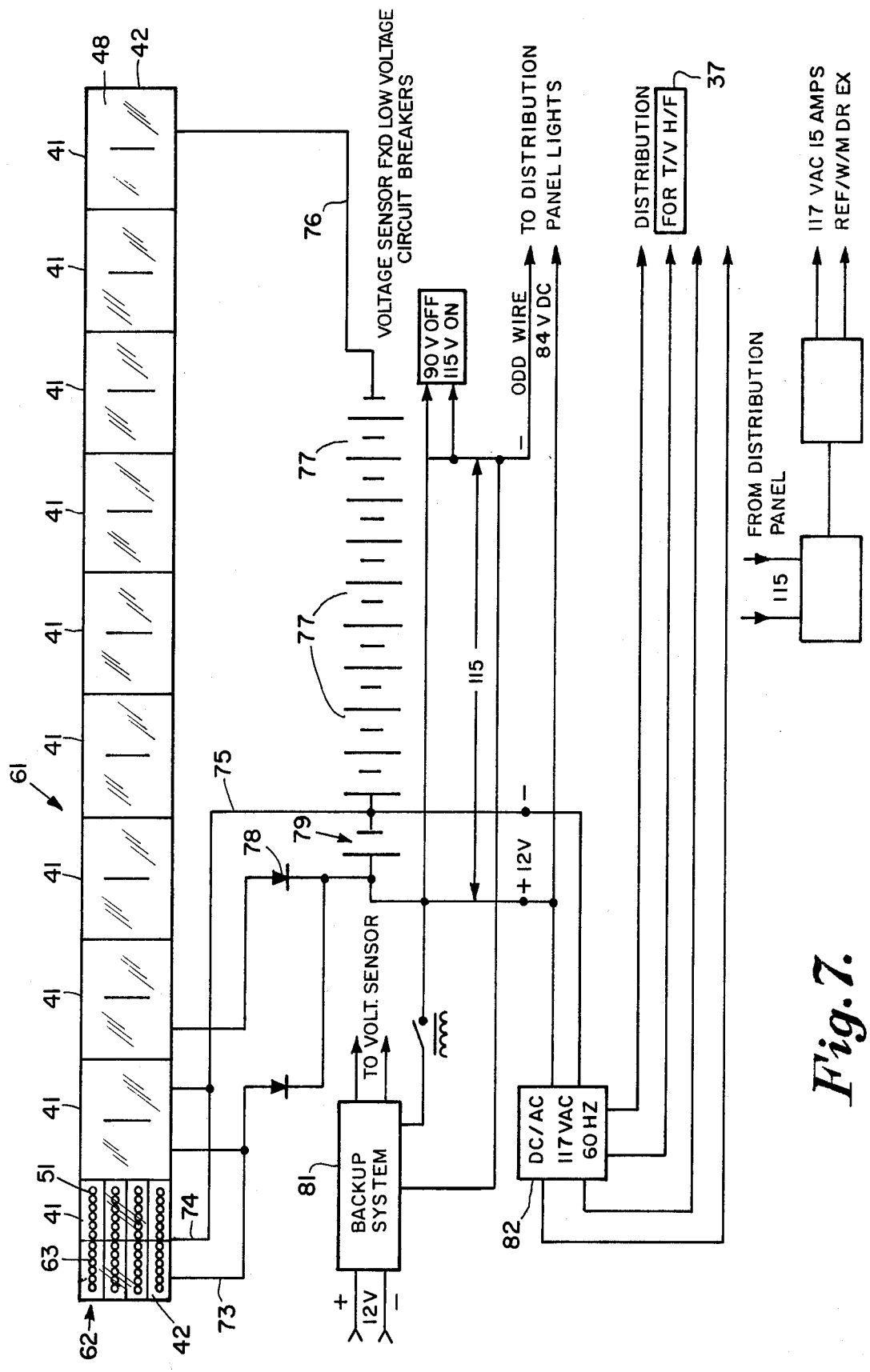
FIG. 7 is a circuit diagram of a typical installation of the system of the invention.

Each power pack unit 41, of the invention preferably comprises 48 solar cells 51 with 48 shells 63 enclosed in a weatherproof enclosure 42, about 40 inches wide by 96 inches long and 7½ inches deep, there being cruciform dividers 72 to form groups of twelve. The 48 cells of each unit are connected in series to conductors 73 and 74 (FIG. 7). The approximate cost of each unit 41 is $600.00 and it produces 150 watts of electrical power, each cell 51 producing 3.5 watts because of the truncated-conical shells 63 rather than 48 × 0.6 or 28.8 watts without the shells, an increase by a factor of six.

The solar system 61 includes about ten power pack units 41, which may be arranged in a string, or row, or in multiple in a frame, the units 41 being electrically connected in series by conductors 75 and 76 into a power circuit including about nine storage batteries 77, and a one way diode 78, to energize the batteries from the light of the sun. The household appliances 36 are powered by batteries 77, or by a back up unit 81, if five or six successive sunless days occur. A separate large battery 79, is connected through a DC/AC converter 82 to the television 37 which requires alternating current. Batteries 77 are preferably of the lead acid type such as an Eastern 375 amp hour battery having a storage capacity of 4500 watts. Nine such batteries in series produce 110 volts DC at 47 amperes for 8 hours and can supply the building 30 for 7 days of energy with 25% generated from the solar panels 61. Such batteries cost in total $847, and weight about 2000 pounds.

Backup unit 81 is an electric starting gasoline engine motor generator, which is automatically connected into the system by the sensing of dull days, rain, etc. Low voltage circuit breakers, voltage regulators and DC to AC invertors, are provided to prevent over-discharge of the batteries, provide a signal to the circuit breakers to open when the energy stored is at its minimum (100 volts) and to close when the batteries are at 110 volts. The DC to AC invertor 82 is a 1200 watt square wave, 60 cycle generator and it is powered with 12 volts DC and turned on by a command from the small appliances. DC to AC Invert Synchronous Convert is a generator powered from 110 volt batteries to operate the heavy appliances, this device consists of a 1.2 horsepower, 110 volt DC motor permanent magnet type driving direct a 3000 watt alternator at a speed of 2500 rpm. A transducer relay supplies the power for on and off as commanded by the appliances.

Air heating means 83 includes the sealed enclosures 42, the heat conductive aluminum shells 63, a cold air inlet 84, connected by air ducts 85 to the space 38 in the cellar 33, or elsewhere in residence 30, and a hot air outlet 86 connected by hot air duct 87 to the heat storage member 39 and thence to the house air heating system 34. The air within the enclosures 42 rises to 200° Fahrenheit or more due to the heat radiation of the sun and the inner walls of the enclosure and the bottom are black to absorb heat. The shells 63 serve as heat absorbers and heat radiators to heat the cold air entering in the lower portions 88 of the enclosures and exiting from the upper portions 89 as hot air. The heat storage member 39 preferably comprises a maze of apertured fire brick, but it could be any well known type of rock storage device. A suction fan 91, powered by the batteries 77, is provided in hot air duct 87.

A supplementary tap water system 92 (FIG. 5) is also provided, consisting of a liquid conduit 93, such as a glass, copper or high temperature plastic tube, extending alongside the peripheries of the cells 51, proximate the plane thereof, to heat the water therein. The tubes 93 extend within the enclosure 42, from a liquid inlet 94 to a liquid outlet 95, the tubes being connected to the hot water storage tank of the main tap water heating system 35, to supplement the hot tap water therein under the control of a thermo-relay valve 96.

As shown in FIG. 6 the truncated conical shells of the invention can be formed by a plurality of coiled convolutions 97 of an elongated tube 98, of square, triangular or rectangular cross section so that a mirror like finish 99 is carried on the inner flared side wall 101 while a fluid 102 such as air or water is heated by the heat of the sun. The small end 103 of the flared coiled tube shell 104 is affixed to the bottom 43 with no integral legs.

While I prefer that the flared, light-collecting, reflective, shells of the invention be full truncated cones and that there be one shell for each solar disc, it has been found that a three quarter, or 270° shell will produce good results. Also, it is possible that one large shell can be provided for a plurality of spaced solar discs but one shell for each cell is preferable for increasing both development of electric energy as well as heat.

It has been found that for example, a cluster of five of the solar cells 51 closely packed in tangential contact all in a flat plane, in combination with a single enlarged light collecting shell 63, having a small opening of the same general area as that of the cluster but an enlarged opening at the light receiving end, instead of producing 5 × 0.6 or 3 watts without the shell, increases almost three times (to 5 × 1.7 watts) to provide 8.5 watts. In other tests, a semi-circular flared shell produced 0.9 watts, as compared to the normal 0.6 watts. A 270° flared shell produced 1.16 watts and a 360° flared shell produced 1.6 watts. A cylindrical shell, developed so much shadow that its effect was negligible in increasing wattage.

I claim:

1. A power pack unit for converting solar energy into electric energy, said pack comprising:

a substantially sealed, weather tight enclosure having a planar bottom of rigid material, upstanding side walls and a top of transparent material;

a plurality of light sensitive, voltage producing solar cells arranged in spaced array on said bottom, each cell being of predetermined area;

a plurality of truncated conical reflectors arranged in spaced array in said enclosure, between said cells and said top for collecting sunlight and heat from a larger total area than the total area of said cells and reflecting said light into said cells and means mounting each said truncated conical reflector with its small end at a predetermined spaced distance above said bottom and its large end at a spaced distance below said top to permit circulation of air within and around said enclosure.

2. A power pack unit as specified in claim 1 wherein:

each said reflector is of heat conductive aluminum with its truncated conical side wall inclined at about seventy five degrees from the plane of said planar bottom of said enclosure and having an inner, mirror-like reflective surface.

3. A power pack unit as specified in claim 1 wherein:

said means for mounting said reflectors comprises leg means supporting the small end thereof, and affixed to said planar bottom, to position said shell at said predetermined height thereabove for circulation of air therearound.

4. A power pack unit as specified in claim 1 wherein:

said truncated conical reflectors are of heat conductive material, each having a mirror-like inner surface reflecting light received in the large end thereof, into said solar cell mounted below the small end thereof and;

said enclosure includes a cold air inlet, a hot air outlet and a liquid conduit connecting a liquid inlet to a liquid outlet, whereby said enclosure and said shells are heated by the sun to deliver heated air from said air outlet and heated liquid from said liquid outlet while said cells generate electricity.

5. A power pack unit as specified in claim 1 wherein:

said truncated conical reflectors are of heat conductive material, each having a mirror-like inner surface reflecting light received in the large end thereof into one of said solar cells at the small end thereof;

said enclosure includes a cold water supply conduit, extending from outside said enclosure in a circuitous path alongside the outer peripheries of said cells and thence back outside said enclosure;

whereby said conduit picks up heat in said enclosure, and from said shells, to deliver heated water from said enclosure while said cells generate electricity.

6. A power pack unit as specified in claim 1 wherein:

said truncated conical reflectors are each formed of a plurality of convolutions of hollow tubing, said tubing being interconnected throughout said enclosure and having an inlet end and an outlet end outside said enclosure;

whereby the inner mirror-like surface of said convoluted tube reflectors reflects light to said solar cells while fluid within said tubing becomes heated by solar radiation.

7. A power pack unit for converting solar energy into electric energy, said pack comprising:

a plurality of electrically-linked, light sensitive, voltage producing solar cells arranged in spaced array on a rigid backing;

a plurality of open-ended, truncated-conical light-collector shells of heat conductive sheet metal, each with its large end adapted to face the sun, the inner surface of its truncated conical side wall having a light reflective surface and its small end supported on legs at a spaced distance above said backing, to encircle a said cell;

and weathertight enclosure means on said backing, enclosing said cells and shells, said means including a transparent top at a predetermined distance above the large ends of said shells for admitting sunlight thereinto, whereby air may circulate around the large ends, side walls and small ends of said shells.

8. A power pack unit as specified in claim 7 wherein said enclosure means includes fluid inlet means and fluid outlet means for heating a fluid within said enclosure.

9. A system for converting solar energy into electric energy while also producing heat, said system comprising:

a building having a plurality of electric appliances and a hot air heating system and;

a power pack unit, said unit including:

a weathertight, insulated, enclosure associated with said building, said enclosure having a rigid planar bottom, side walls upstanding therefrom and a transparent top;

said enclosure being inclined at a selected angle to the horizontal with said transparent top facing generally South;

a plurality of electrically-linked, light-sensitive voltage-producing solar cells spaced on said bottom, each of predetermined area;

a plurality of truncated-conical shells of heat conductive material mounted within said enclosure, each having leg means supporting its small end at a spaced distance above, and encircling one of said cells, its inner side wall having a reflective surface and its large end at a spaced distance below said transparent top and facing the sun electric circuit means including said cells, a one way diode, a weries of storage batteries and said appliances; further including liquid circulation means within said enclosure;

and air heating means including a cold air inlet to said enclosure connected to the space within said building, heat conductive material forming said shells, and a hot air outlet from said enclosure connected to the hot air heating system of said building, said means including a heat storage member of fire brick interposed between said enclosure and said hot air heating system.

10. A system as specified in claim 9 wherein:

said building includes a main tap water heating system and said liquid circulation means comprises a water conduit extending into said enclosure from the hot water tank of said main system, said conduit traversing said enclosure and then connecting back to said tank, there being a thermal relay valve in said liquid circulation means for controlling the same.

11. A power pack unit for converting solar energy into electric energy, said pack comprising:

a substantially sealed, weather tight enclosure having a planar bottom of rigid material, upstanding side walls and a top of transparent material;

a plurality of light sensitive, voltage producing solar cells arranged in spaced array on said bottom, each cell being of predetermined area;

a plurality of truncated conical reflectors arranged in spaced array in said enclosure, between said cells and said top for collecting sunlight and heat from a larger total area than the total area of said cells and reflecting light into said cells, each said shell being of heat conductive material, having a mirror-like inner surface reflecting light, received in the large end thereof, through the open small end thereof into a cell mounted below said small end thereof;

means mounting each said truncated conical reflector with its said small end at a predetermined spaced distance above said bottom to permit circulation of air within and around said enclosure;

and said enclosure having a cold air inlet and a hot air outlet.

whereby said cells generate electricity while said reflectors absorb heat from the sun to heat air within said enclosure.

* * * * *